(12) United States Patent
Kamei et al.

(10) Patent No.: US 8,016,976 B2
(45) Date of Patent: Sep. 13, 2011

(54) FILM REMOVING DEVICE AND FILM REMOVING METHOD

(75) Inventors: Shigenori Kamei, Koshi (JP); Kotaro Ooishi, Koshi (JP); Masahito Hamada, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 1070 days.

(21) Appl. No.: 11/831,190

(22) Filed: Jul. 31, 2007

(65) Prior Publication Data

US 2008/0041523 A1 Feb. 21, 2008

(30) Foreign Application Priority Data

Aug. 1, 2006 (JP) ................................. 2006-209421

(51) Int. Cl.
*B29C 63/00* (2006.01)
(52) U.S. Cl. ................... 156/345.55; 134/902; 156/344; 156/584
(58) Field of Classification Search ............ 156/345.55, 156/344, 584; 134/902
See application file for complete search history.

(56) References Cited

U.S. PATENT DOCUMENTS

| | | | | |
|---|---|---|---|---|
| 5,871,584 | A * | 2/1999 | Tateyama et al. | 118/323 |
| 6,669,809 | B2 * | 12/2003 | Hashimoto et al. | 156/345.2 |
| 6,827,814 | B2 * | 12/2004 | Taniyama et al. | 156/345.12 |
| 2004/0226916 | A1 | 11/2004 | Kobayashi et al. | |
| 2005/0067100 | A1 * | 3/2005 | Kobayashi et al. | 156/345.11 |
| 2008/0041523 | A1 * | 2/2008 | Kamei et al. | 156/344 |

FOREIGN PATENT DOCUMENTS

| JP | 05-104055 | 4/1993 |
|---|---|---|
| JP | 2004-363565 | 12/2004 |

OTHER PUBLICATIONS

Office Action issued Mar. 17, 2011, Japan Patent Application No. 2006-209421, filed Aug. 1, 2006 (with English-language Translation).

* cited by examiner

*Primary Examiner* — Sylvia R. MacArthur
(74) *Attorney, Agent, or Firm* — Oblon, Spivak, McClelland, Maier & Neustadt, L.L.P.

(57) ABSTRACT

A film removing device includes an approach stage having a flat approach part having a surface substantially flush with the surface of a substrate supported on a support member. The flat approach part faces a first side surface of the substrate at a corner of the substrate where the first side surface and a second side surface of the substrate join. A film removing nozzle spouts a solvent toward a peripheral part of the substrate and sucks a solution while being moved along the second side surface and the approach stage. A gas is spouted into a gap between the flat approach part and the corner of the substrate so that the gas flows through the gap toward the second side surface.

7 Claims, 12 Drawing Sheets

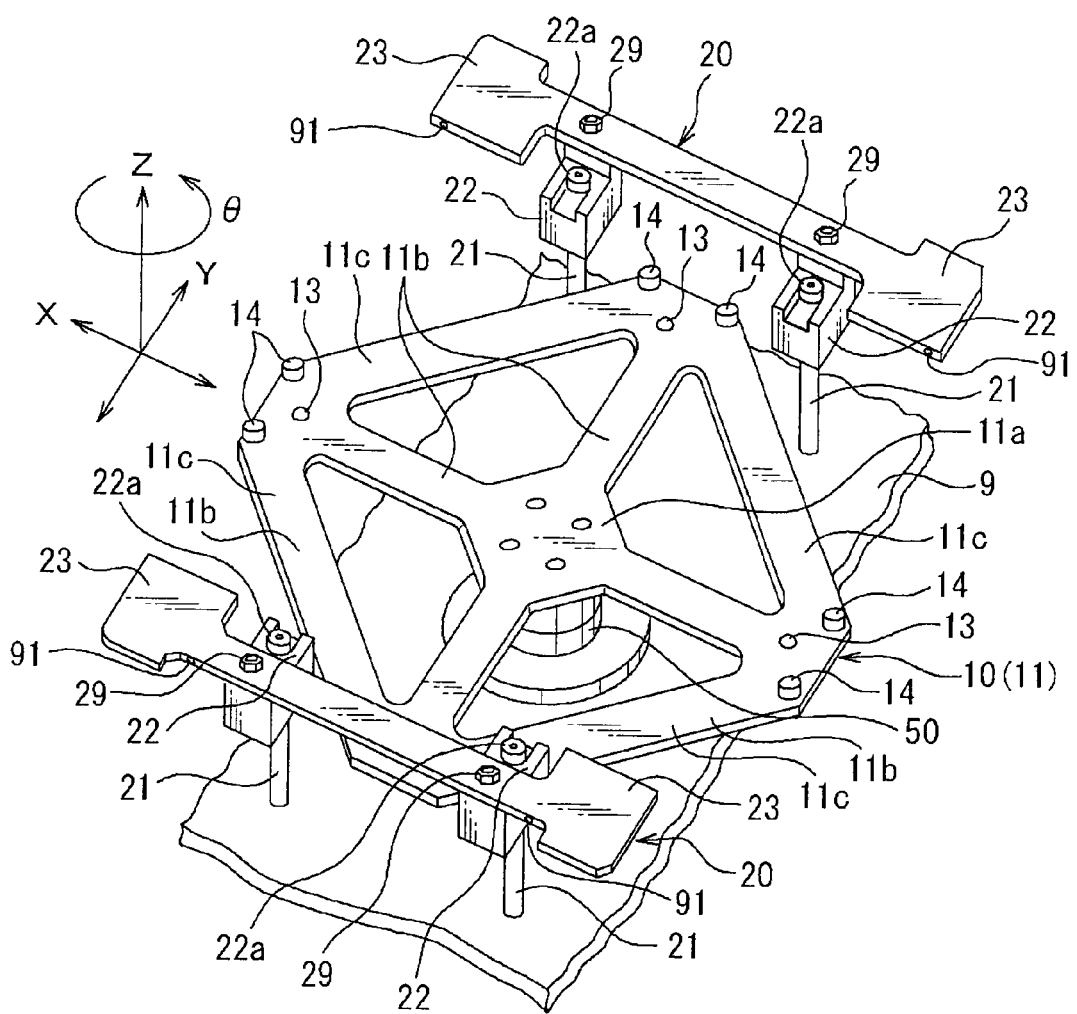
F I G. 6

ND FILM
FILM REMOVING DEVICE AND FILM REMOVING METHOD

CROSS-REFERENCE TO RELATED APPLICATION

This application is based upon and claims the benefit of priority from the prior Japanese patent Application No. 2006-209421 filed on Aug. 1, 2006, the entire content of which is incorporated herein by reference.

BACKGROUND OF THE INVENTION

1. Field of the Invention

The present invention relates to a film removing device for and a film removing method of removing a film from, for example, photomask substrates, namely, reticles, and glass substrates for FPDs (flat panel displays).

2. Description of the Related Art

Generally, processes for manufacturing, for example, photomasks and liquid crystal displays (LCDs), similarly to semiconductor device fabricating processes, uses photolithography for forming, for example, a thin film of ITO (indium tin oxide) or a circuit pattern on a substrate. For example, a resist solution application process applies a resist solution to a surface of a substrate so as to form a resist film, an exposure process exposes the resist film so as to form a latent circuit pattern in the resist film, and a developing process develops the latent circuit pattern so as to form a circuit pattern.

A coating method what is called the spin coating method is used widely by the resist solution application process. It occurs sometimes, when a resist solution is applied to a substrate by the spin coating method in the resist solution application process, that the resist solution is attracted to a peripheral part of the substrate by the agency of surface tension after the rotation of the substrate is stopped and any centrifugal force acts on the film of the resist solution, and the thickness of a part of the film of the resist solution on the peripheral part of the substrate increases. In some cases, part of the resist solution poured onto the upper surface of the substrate flows around the edge of the substrate to the lower surface of the substrate to form an unnecessary resist film on a peripheral part of the substrate. Such an unnecessary resist film needs to be removed.

A known thin film removing device (method) disclosed in US 2004/0226916 A1 includes approach stages disposed close to the periphery of a substrate supported on support members and including flat approach parts respectively having surfaces flush with the surface of the substrate. The entire content of US 2004/0226916 A1 is incorporated herein by reference. In this known thin film removing device (method), a removing unit jets a solvent toward the peripheral part of the substrate and the removing unit sucks a solution produced by dissolving the thin film in the solvent, while the removing unit is being moved along the peripheral part of the substrate and the approach stage. This thin film removing device (method) can remove straight parts of the thin film on the corners of the substrate and can suppress the creation of mist.

However, in some cases, the thin film removing device (method) cannot suck all the solution wetting the side surfaces of the substrate. In some cases, the solution wetting the side surfaces of the substrate flows onto the upper surface of the substrate and forms stains in part of the thin film on the corners of the substrate. The stains formed in the thin film spoils the appearance of the substrate. If part of the thin film for forming a circuit pattern is stained, the thin film cannot be used for forming the circuit pattern.

SUMMARY OF THE INVENTION

The present invention has been made in view of those problems and it is therefore an object of the present invention to provide a thin film removing device and a thin film removing method capable of suppressing staining parts of a thin film formed on corners of the substrate during a thin film removing process for removing unnecessary parts of the thin film formed on a peripheral part of the substrate.

A first film removing device according to the present invention for removing an unnecessary part, formed on a peripheral part of a substrate having a corner, of a film of a coating solution formed on the substrate by spouting a solvent on the peripheral part of the substrate, said film removing device comprising: a support member that supports the substrate; an approach stage disposed near a first side surface of the substrate supported on the support member, the approach stage having a flat approach part having a surface flush with a surface of the substrate supported on the support member; a film removing unit provided with a spouting port through which the solvent is spouted toward the peripheral part of the substrate supported on the support member and a suction port through which a solution is sucked; a moving mechanism configured to move the film removing unit along a second side surface, continuous with the first side surface, of the substrate supported on the support member and the approach stage; and a gas spouting system configured to spout a gas into a gap formed between the flat approach part of the approach stage and the substrate supported on the support member; wherein the flat approach part faces the first side surface of the substrate supported on the support member at the corner where the first side surface and the second side surface join, and the gas spouting system spouts the gas into the gap formed between a side surface, facing the substrate, of the flat approach part and the first side surface, corresponding to the corner, of the substrate supported on the support member along the first side surface toward a side of the second side surface.

In the first film removing device according to the present invention, the gas spouting system may be provided with a spouting port opening in the side surface, facing the substrate, of the flat approach part, and a gas discharge passage having one end connected to the spouting port. In the film removing device, at least a part, including the one end connected to the spouting port and extending near the substrate supported on the support member, of the discharge passage may be inclined at an angle of 45° or below to a direction parallel to the first side surface of the substrate supported on the support member.

In the first film removing device according to the present invention, the gas spouting system may be provided with a nozzle having a discharge passage substantially parallel to the first side surface of the substrate supported on the support member so as to spout the gas in a direction substantially parallel to the first side surface of the substrate.

In the first film removing device according to the present invention, the flat approach part may have a protrusion protruding toward the substrate, the gas spouting system may be provided with a spouting port opening in the protrusion and a discharge passage having one end connected to the spouting port, the discharge passage may be extended in the protrusion from the spouting port substantially parallel to the first side surface of the substrate supported on the support member, and the gas spouting system may spout the gas in a direction substantially parallel to the first side surface of the substrate supported on the support member.

The first film removing device according to the present invention may further include a suction mechanism that sucks a gas, or a gas and a liquid drop from the gap between the flat approach part of the approach stage and the substrate supported on the support member. In this film removing device according to the present invention, the gas spouting system may have a spouting port opening in the side surface, facing the substrate, of the flat approach part, and a discharge passage having one end connected to the spouting port, the suction mechanism has a suction port opening in the side surface, facing the substrate, of the flat approach, and a suction passage having one end connected to the suction port, and the spouting port of the gas spouting system opens in the side surface of the flat approach part facing the substrate at a position nearer to the second side surface of the substrate than the suction port of the suction mechanism.

The first film removing device according to the present invention may further include a substrate holding mechanism, that delivers a substrate to and receives the same from the support member, capable of moving vertically and of turning about a vertical axis through an angle of 90°.

A second film removing device according to the present invention for removing an unnecessary part, formed on a peripheral part of a substrate having a corner, of a film of a coating solution formed on the substrate by spouting a solvent on the peripheral part of the substrate, said film removing device comprising: a support member that supports the substrate; an approach stage disposed near a first side surface of the substrate supported on the support member, the approach stage having a flat approach part having a surface flush with a surface of the substrate supported on the support member; a film removing unit provided with a spouting port through which the solvent is spouted toward the peripheral part of the substrate supported on the support member and a suction port through which a solution is sucked; a moving mechanism configured to move the film removing unit along a second side surface, continuous with the first side surface, of the substrate supported on the support member and the approach stage; and a controller that controls the film removing unit and the moving mechanism; wherein the flat approach part faces the first side surface of the substrate supported on the support member at the corner where the first side surface and the second side surface join, and the controller controls the film removing unit and the moving mechanism such that the film removing unit executes a sucking operation to suck a gas, or a gas and liquid a drop through the suction port from a gap formed between the substrate supported on the support member and the flat approach part at least while the film removing unit is moving past a position facing the gap.

The second film removing device according to the present invention may further include a substrate holding mechanism, that delivers a substrate to and receives the same from the support member, capable of moving vertically and of turning about a vertical axis through an angle of 90°.

A first film removing method according to the present invention of removing an unnecessary part, formed on a peripheral part of a substrate having a corner, of a film of a coating solution formed on the substrate by spouting a solvent on the peripheral part of the substrate, said film removing method comprising: a substrate mounting step of mounting the substrate on a support member with a first side surface of the substrate extended near an approach stage; and a film removing step of spouting a solvent toward the peripheral part of the substrate by a film removing unit and sucking a solution by the film removing unit while the film removing unit is being moved along a second side surface, continuous with the first side surface, of the substrate and the approach stage; wherein in the substrate mounting step, the substrate is supported on the support member such that the first side surface faces a flat approach part of the approach stage at the corner, where the first side surface and the second side surface of the substrate join, and a surface of the substrate is substantially flush with a surface of the flat approach part of the approach stage, and in the film removing step, a gas is spouted into a gap formed between a side surface, facing the substrate, of the flat approach part and the first side surface, corresponding to the corner, of the substrate along the first side surface toward a side of the second side surface by a gas spouting system so as to prevent a solution from flowing into the gap, at least while the film removing unit is moving past a position facing the gap.

In the first film removing method according to the present invention, in the film removing step, a suction mechanism may suck a gas, or a gas and a liquid drop from the gap while the gas spouting system is spouting the gas into the gap so as to prevent the solution from flowing into the gap. The first film removing method according to the present invention may be used for removing an unnecessary parts of a film formed on a quadrilateral substrate. This first film removing method may further include: a position changing step of changing an position of the substrate by lifting up the substrate from the support member and turning the substrate through an angle of 90° about a vertical axis after the completion of the film removing step; a second substrate mounting step of mounting the substrate again on the support member with the second side surface, continuous with the first side surface, of the substrate extended near the approach stage; and a second film removing step of spouting a solvent toward the peripheral part of the substrate by the film removing unit and sucking a solution by the film removing unit while the film removing unit is being moved along a third side surface, continuous with the second side surface and opposite to the first side surface, of the substrate and the approach stage; wherein in the second substrate mounting step, the substrate is supported on the support member such that the second side surface faces the flat approach part of the approach stage at a second corner, where the second side surface and the third side surface of the substrate join, and the surface of the substrate is substantially flush with the surface of the flat approach part of the approach stage, and a gas is spouted into a gap formed between the side surface, facing the substrate, of the flat approach part and the second side surface, corresponding to the second corner, of the substrate along the second side surface toward a side of the third side surface by the gas spouting system so as to prevent a solution from flowing into the gap at least while the film removing unit is moving past a position facing the gap. In at least one of the film removing step and the second film removing step of this film removing method, a suction mechanism may suck a gas, or a gas and a liquid drop from the gap while the gas spouting system is spouting the gas into the gap so as to prevent the flow of the solution into the gap.

A second film removing method according to the present invention of removing an unnecessary part, formed on a peripheral part of a substrate having a corner, of a film of a coating solution formed on the substrate by spouting a solvent on the peripheral part of the substrate, said film removing method comprising: a substrate mounting step of mounting the substrate on a support member with a first side surface of the substrate extended near an approach stage; and a film removing step of spouting a solvent toward the peripheral part of the substrate by a film removing unit and sucking a solution by the film removing unit while the film removing unit is being moved along a second side surface, continuous with the first side surface, of the substrate and the approach stage; wherein in the substrate mounting step, the substrate is supported on the support member such that the first side surface faces a flat approach part of the approach stage at the corner, where the first side surface and the second side surface of the substrate join, and a surface of the substrate is substantially flush with a surface of the flat approach part of the approach stage, and in the film removing step, the film removing unit sucks a gas, or a gas and a liquid drop from a gap formed between the substrate and the flat approach part so as to prevent a solution from flowing into the gap at least while the film removing unit is moving past a position facing the gap.

The second film removing method according to the present invention may be used for removing an unnecessary parts of a film formed on a quadrilateral substrate. This second film removing method may further include: an position changing step of changing an position of the substrate by lifting up the substrate from the support member and turning the substrate through an angle of 90° about a vertical axis after the completion of the film removing step; a second substrate mounting step of mounting the substrate again on the support member with the second side surface, continuous with the first side surface, of the substrate extended near the approach stage; and a second film removing step of spouting a solvent toward the peripheral part of the substrate by the film removing unit and sucking a solution by the film removing unit while the film removing unit is being moved along a third side surface, continuous with the second side surface and opposite to the first side surface, of the substrate and the approach stage; wherein in the second substrate mounting step, the substrate is supported on the support member such that the second side surface faces the flat approach part of the approach stage at a second corner, where the second side surface and the third side surface of the substrate join, and the surface of the substrate is substantially flush with the surface of the flat approach part of the approach stage, and in the second film removing step, the film removing unit sucks a gas, or a gas and a liquid drop from a gap formed between the substrate and the flat approach part so as to prevent a solution from flowing into the gap at least while the film removing unit is moving past a position facing the gap.

According to the present invention, the film removing device can carry out stable operations for spouting the solvent and sucking the solution for the sides and the corners of the substrate, and the coating solution can be prevented from flowing from the side surface of the substrate through a top of the corner to the adjacent side surface of the substrate while the film removing unit is in a film removing operation for removing the unnecessary parts of the film by spouting the gas by the gas spouting system. Thus the film removing device and the film removing method can remove straight parts of the thin film on the corners of the substrate, can suppress the creation of mist and can suppress staining parts of the film formed on the corners of the substrate during the thin film removing process.

The suction mechanism sucks a gas and a liquid drop (mist) from the gap formed between the substrate and the approach stage while the gas spouting system is spouting the gas into the gaps. Thus the unnecessary gas and the mist flowing in the gaps toward a side opposite to a side of the side surface of the substrate being processed by the film removing device can be removed.

The quadrilateral substrate is lifted up and is turned through an angle of 90° after the unnecessary parts of the film have been removed from peripheral part extending along one side surface of the substrate so as to remove unnecessary parts of the film from peripheral part extending along another side surface adjacent to the former side surfaces. The film removing device and the film removing method can efficiently remove unnecessary parts of the thin film from a peripheral part of the substrate.

BRIEF DESCRIPTION OF THE DRAWINGS

The above and other objects, features and advantages of the present invention will become more apparent from the following description taken in connection with the accompanying drawings, in which:

FIG. 6 is a perspective view of a substrate holding mechanism (chuck) and an approach stage included in the film removing device shown in FIG. 2A;

DESCRIPTION OF THE PREFERRED EMBODIMENTS

Figure 2A:
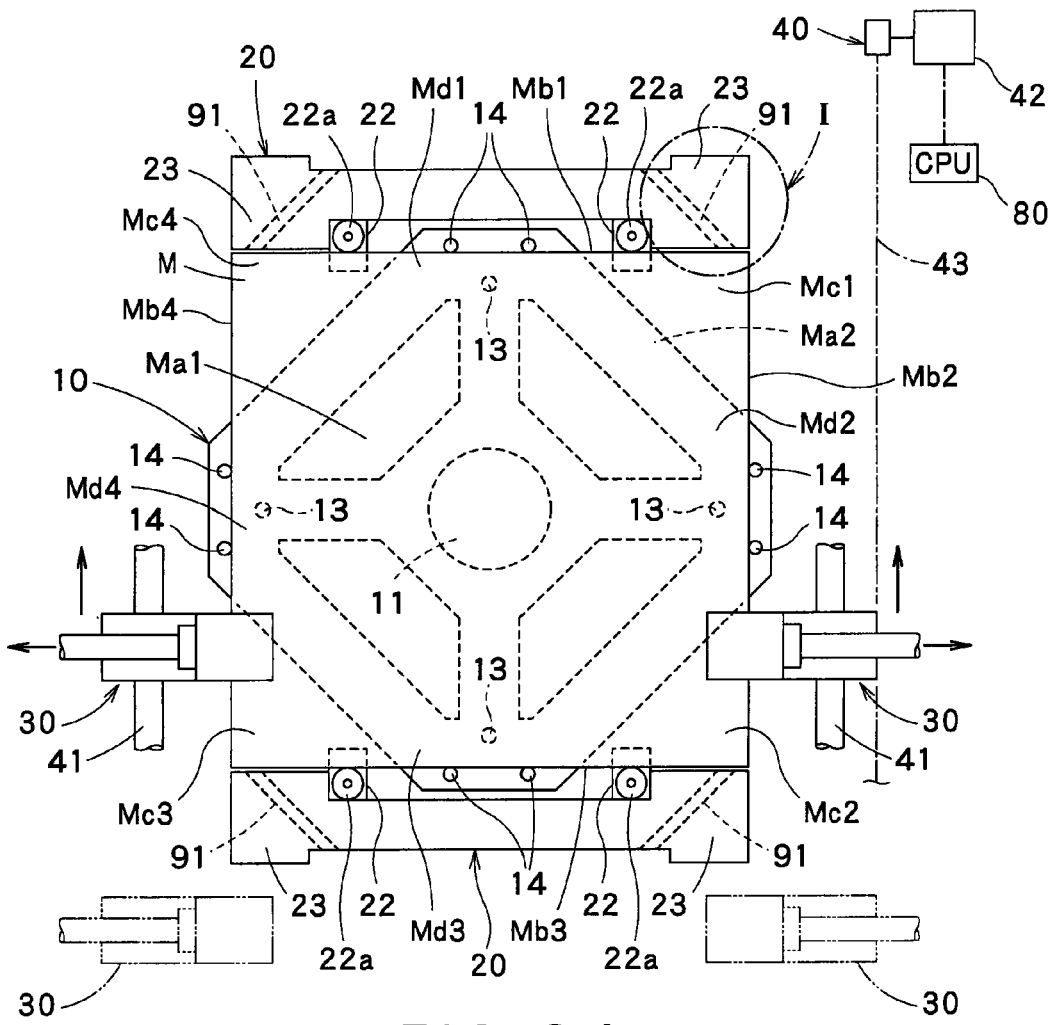
FIG. 2A is a schematic plan view of the film removing device in one embodiment according to the present invention.

A film removing device in a preferred embodiment according to the present invention will be described as applied to a resist solution applying and peripheral resist film removing system for forming a photomask on a substrate. The following description will be made on an assumption that a photomask substrate M (hereinafter, referred to simply as "substrate M") to be processed is a quadrilateral substrate, more specifically, a square substrate M as shown in FIG. 2A, having a pair of opposite surfaces (main surfaces), namely, an upper surface Ma1 and a lower surface Ma2, and a first side surface Mb1, a second side surface Mb2, a third side surface Mb3 and a fourth side surface Mb4. Peripheral parts to be processed of the substrate includes a first corner (a first corner part) Mc1, a second corner (a second corner part) Mc2, a third corner (a third corner part) Mc3, a fourth corner (a fourth corner part) Mc4, a first edge part Md1, a second edge part Md2, a third edge part Md3 and a fourth edge part Md4.

Figure 1:
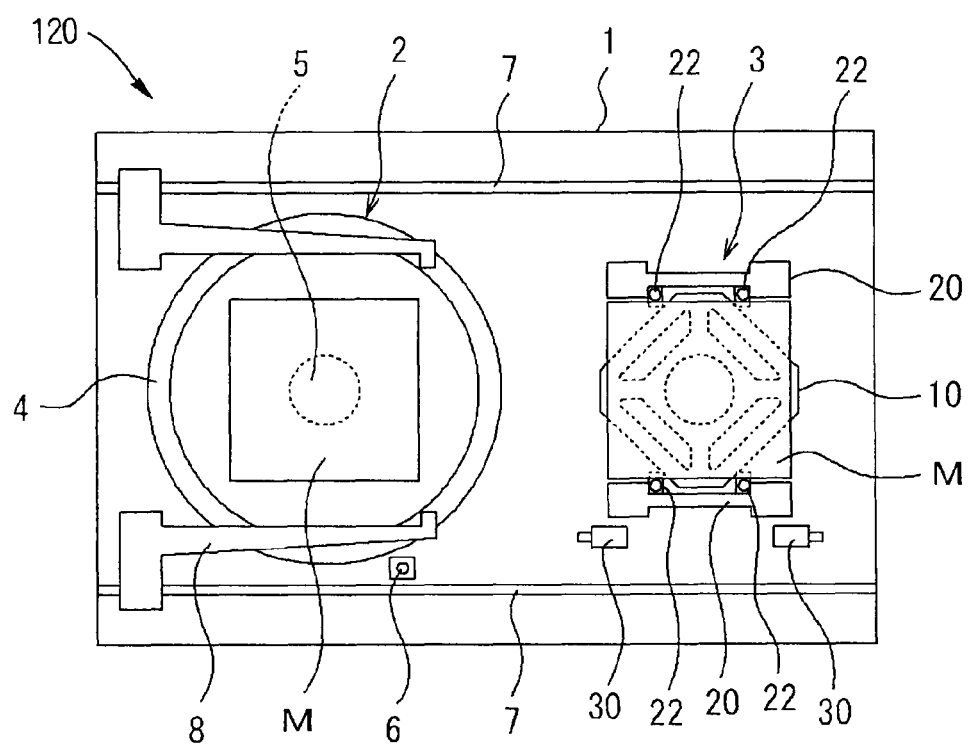
FIG. 1 is a schematic plan view of a resist solution applying and peripheral resist film removing system provided with a film removing device in one embodiment according to the present invention.
Figure 2B:
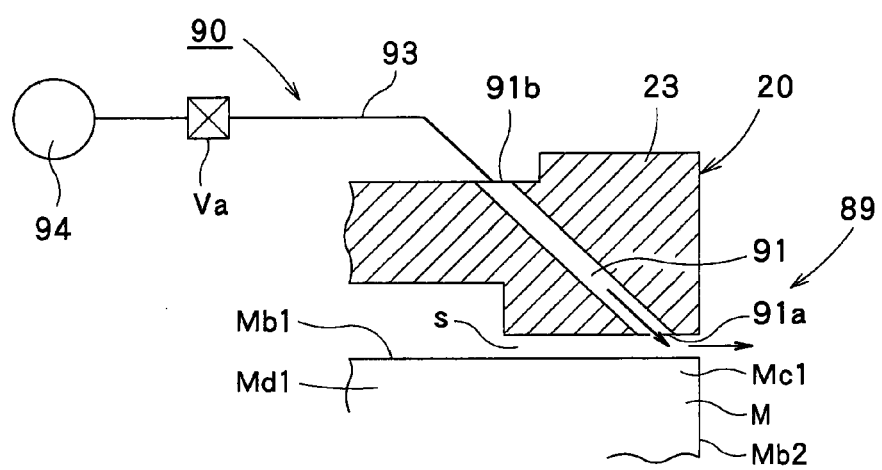
FIG. 2B is an enlarged sectional view of a circle I in FIG. 2A, and shows a gas spouting heads of a gas spouting system included in the film removing device shown in FIG. 2A.
Figure 3:
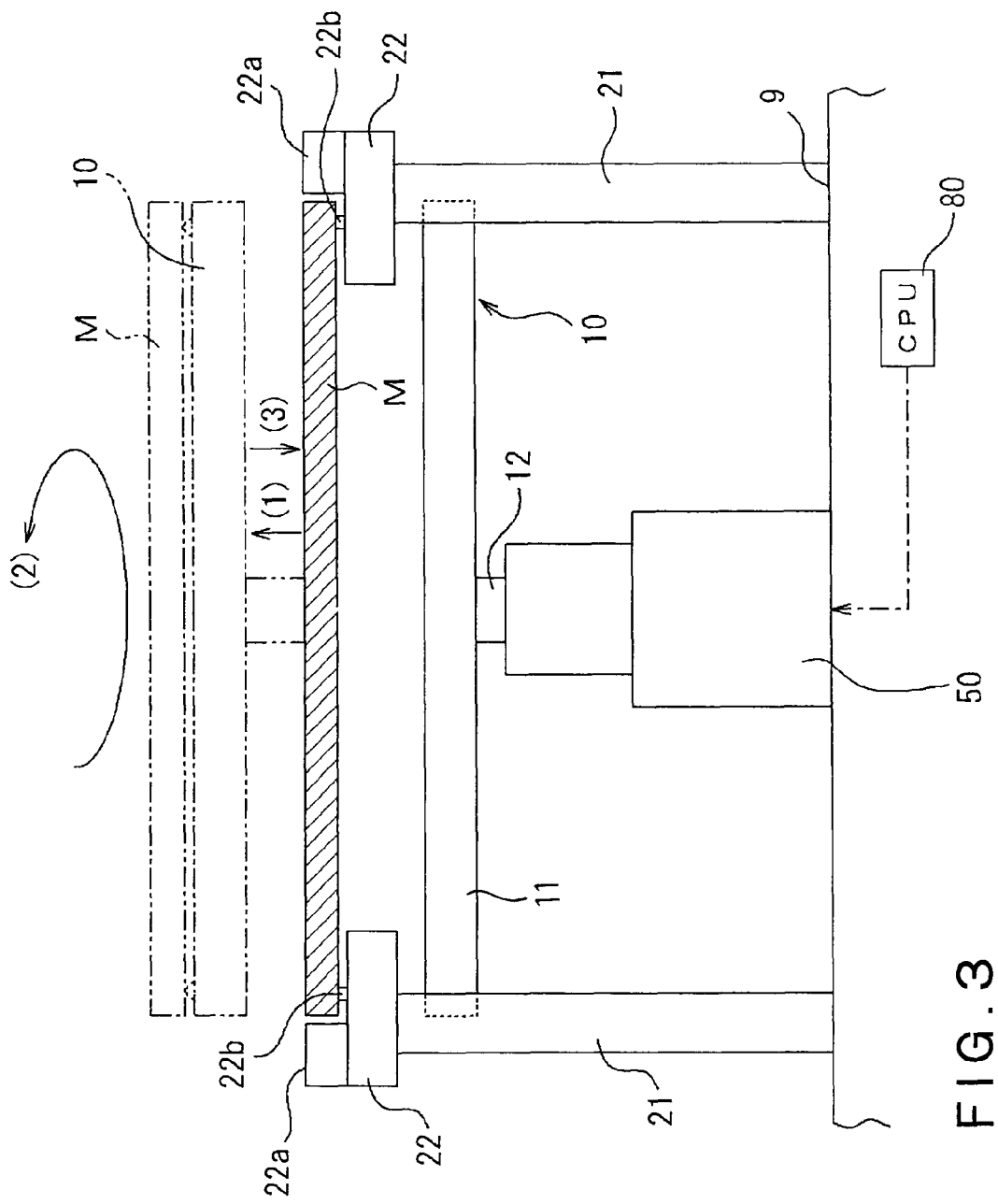
FIG. 3 is a schematic side elevation of the film removing device shown in FIG. 2A.

FIG. 1 is a schematic plan view of a resist solution applying and peripheral resist film removing system 120, FIG. 2A is a schematic plan view of a film removing device in a preferred embodiment, FIG. 2B is an enlarged, sectional view of a part I shown in FIG. 2A and FIG. 3 is a schematic side elevation of the film removing device.

The resist solution applying and peripheral resist film removing system 120 includes a resist solution applying device 2, a peripheral film removing device (film removing device) 3, and a casing 1 surrounding the resist solution applying device 2 and the peripheral film removing device 3. The resist solution applying device 2 and the peripheral film removing device 3 are juxtaposed.

The resist solution applying device 2 includes a rotary cup 4, namely, a processing vessel, a spin chuck 5 for supporting the substrate M in the rotary cup 4, and a resist solution pouring nozzle 6 for pouring down a resist solution onto a central part of the substrate M supported on the spin chuck 5.

The resist solution applying device 2 locates the resist solution pouring nozzle 6 to a position above the center of the substrate M supported on the spin chuck 5 and pours down the resist solution through the resist solution pouring nozzle 6 onto a central part of the substrate M. Subsequently, the spin chuck 5 is rotated at a high rotating speed to spread the resist solution over the substrate M by centrifugal force. Thus the resist solution is spread in a uniform, thin film on the substrate M.

The spin chuck 5 is rotated together with the cup 4 (inner cup) at a high rotating speed to rotate the substrate M. This method of spreading the resist solution over the surface of the substrate M is employed in forming a circuit pattern on a semiconductor wafer. However, it is difficult for this method to spread the resist solution uniformly over the surface of the substrate M for a photomask as compared with spreading the resist solution on a wafer because the substrate M is quadrilateral (square). Particularly, the four corners Mc1 to Mc4 of the substrate M are at a long distance from the center of the substrate M, Therefore, the circumferential speed of the corners Mc1 to Mc4 is considerably high and it is possible that the corners Mc1 to Mc4 turning at a high circumferential speed generate turbulent air currents around the substrate M. The volatilization of a solvent contained in the resist solution needs to be prevented as effectively as possible so that the resist solution spreads over the upper surface Ma1 at a fixed spreading speed to spread the resist solution uniformly over the upper surface Ma1. Therefore, a photomask substrate fabricating system does not rotate only the substrate M. The photomask substrate fabricating system seals the substrate M in the cup 4, and rotates the substrate M together with the cup 4 in order to prevent the volatilization of the solvent and the generation of turbulent air currents around the substrate M.

The substrate M thus coated with a resist solution film is carried by a pair of carrying arms (substrate carrying mechanism) 8 that moves along guide rails 7 to the peripheral film removing device 3.

Figure 5:
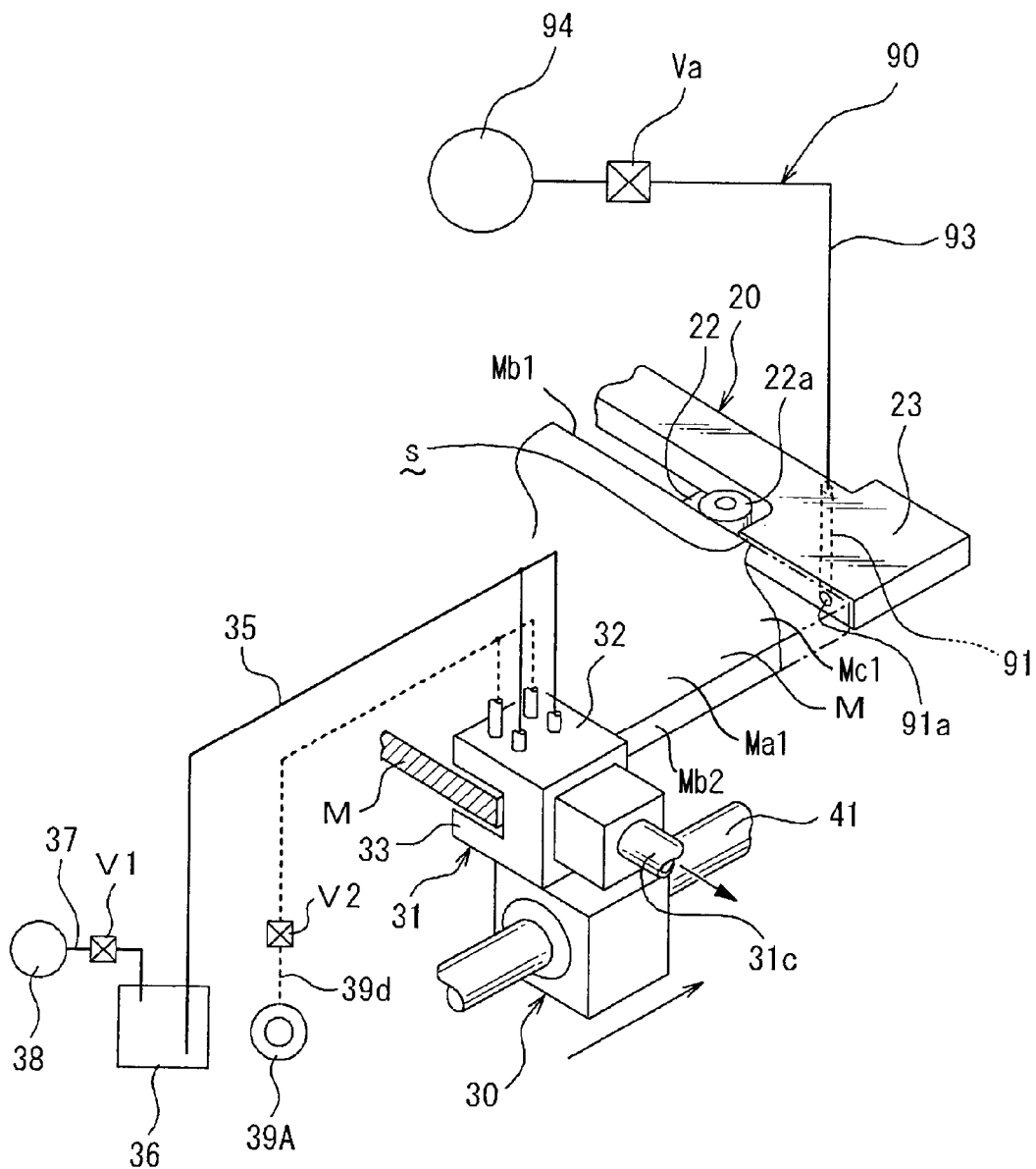
FIG. 5 is a perspective view of the removing unit (resist film removing nozzle) and an approach stage included in the film removing device shown in FIG. 2A.

Referring to FIGS. 2A and 2B, the peripheral film removing device 3, namely, the film removing device, includes support members (support stage) 22 for supporting the substrate M thereon, a substrate holding mechanism 10, (namely, a chuck 10 in this embodiment), to which the substrate M is transferred from and from which the substrate M is transferred to the support members 22, two approach stages 20, namely, first and second approach stages 20, disposed near the two opposite side surfaces of the substrate M (the first side surface Mb1 and the third side surface Mb3 in a state shown in FIG. 2A) supported on the support members 22, respectively, and two resist film removing nozzles 30 (hereinafter, referred to as "film removing nozzles 30"), provided with spouting nozzle holes 34a and 34b for spouting a solvent toward peripheral parts of the substrate M supported on the support members 22 and suction passages 31b for sucking a solution, respectively. As shown in FIG. 2A, the two film removing nozzles 30 are connected to a moving mechanism 40. Each of the approach stages 20 has flat approach parts 23 in opposite end parts thereof. As shown in FIG. 5, the upper surfaces of the flat approach parts 23 are substantially flush with the upper surface Ma1 of the substrate M supported on the support members 22. The moving mechanism 40 can move the film removing nozzles 30 along the two other opposite side surfaces (the side surfaces Mb2 and Mb4 in the state shown in FIG. 2A) and the approach stages 20. The two other opposite side surfaces are continuous with the two opposite side surfaces. Each flat approach part 23 faces the corner from a side of each of the two opposite side surfaces, each corner being formed by a portion where each of the two opposite side surfaces (the side surfaces Mb1 and Mb3 in the state shown in FIG. 2A) and each of the two other opposite side surfaces (the side surfaces Mb2 and Mb4 in the state shown in FIG. 2A) join. As clearly shown in FIG. 2B, the peripheral film removing device (the film removing device) 3 is provided with a gas spouting system 90 including gas spouting heads 89 for spouting a gas into a gaps s formed between the flat approach parts 23 of the approach stages 20 and the substrate supported on the support members. As stated below, the gas spouting heads 89 of the gas spouting system 90 are configured to spout gas into gaps s formed between side surfaces of the flat approach parts 23 facing the corners and the two opposite side surfaces in corners (in the state shown in FIG. 2A, a gap s formed between the substrate M supported on the support members 22 and the flat approach part 23 of the approach stage 20. In a state shown in FIG. 2A, the gas spouting head of the gas spouting system 90 spout a gas into the gap s formed between the first side surface Mb1 and a side surface of the flat approach part 23 facing the first side surface Mb1 at the first corner Mc1, between the first side surface Mb1 and a side surfaces of the flat approach parts 23 facing the first side surface Mb1 at the fourth corner Mc4, between the third side surface Mb3 and a side surfaces of the flat approach parts 23 facing the third side surface Mb1 at the second corner Mc2, and between the third side surface Mb3 and a side surface of the flat approach part 23 facing the third side surface Mb3 at the third corner Mc3) along the two opposite side surfaces toward the two other opposite side surfaces.

Referring to FIGS. 3 and 6, the chuck 10, namely, the substrate holding mechanism includes a chuck body 11 for holding the substrate M, a support shaft 12 supporting the chuck body 11, and a lifting and rotating mechanism 50 for vertically moving and rotating the support shaft 12. The lifting and rotating mechanism 50 can move the chuck body 11 in vertical directions, namely, Z-axis directions, and can rotate the chuck body in a horizontal plane defined by the X-axis and the Y-axis. The lifting and rotating mechanism 50 and the moving mechanism 40 are electrically connected to a central processing unit 80 (hereinafter, referred to as "CPU 80"), namely, a controller, and are controlled by control signals provided by the CPU 80. As shown in FIG. 6, in this embodiment, the chuck body 11 has a hub 11a connected to the upper end of the support shaft 12 and having the shape of a flat, quadrilateral plate, four plate-shaped arms 11b radially projecting from the corners of the hub 11a, and a plate-shaped frame connected to the outer ends of the four arms 11b. The four corners of the frame 11c are chamfered in a flat shape. Four support pins 13 project upward from the four corners of the frame 11c, respectively, to support the substrate M with a narrow space formed between the upper surface of the chuck body 11 and the lower surface Ma2 of the substrate M. Two holding pins 14 project from each corner of the frame 11c on the outer side of each the support pin 13. When the substrate M is placed on the chuck body 11, the holding pins 14 come into contact with the side surfaces of the substrate M to restrain the substrate M from movement on the chuck body 11.

As shown in FIGS. 3 and 6, the support members 22 are connected to the tops of support rods 21 set up on a base 9. The support members 22 have the shape of a block. As shown in FIG. 6, each of the approach stages 20 is fixed to the support member 22 with a bolt 29 so that the support surface thereof is substantially horizontal. As shown in FIG. 3, each of the support members 22 of this embodiment is provided with a positioning pin 22a and a proximity pin 22b. The positioning pins 22a come into contact with the edges of the substrate M to position the substrate M correctly. The proximity pins 22b support the substrate M with a narrow gap of, for example, 0.2 mm in thickness formed between the upper surface of each support member 22 and the lower surface Ma2 of the substrate M.

The approach stage 20 will be described. The approach stage 20 has the substantially rectangular opposite flat approach parts 23. The upper surfaces of the flat approach parts 23 are substantially flush with the upper surface Ma1 of the substrate M supported on the support members 22. The approach stages 20 extend along the opposite side surfaces of the substrate M supported on the support members 22, respectively. Each flat approach part 23 faces one of the two opposite side surfaces in a corner formed by a joining portion between one of the two opposite side surfaces and one of the two other opposite side surfaces. In a state shown in FIG. 2A, the approach stages 20 extend along the first side surface Mb1 and the third side surface Mb3, respectively. In the state shown in FIG. 2A, the opposite end surfaces, in a direction parallel to first and third side surfaces Mb1 and Mb3, of the approach stages 20 are aligned with the second side surface Mb2 and the fourth side surface Mb4 of the substrate M, respectively. The thickness of the gaps s each formed between the side surface of the substrate M supported on the support members 22 and the side surface, facing the side surface of the substrate M, of the flat approach part 23 of the approach stage 20 is, for example, 1.5 mm or above. As shown in FIG. 2A, the approach stages 20 have a width equal to or greater than that of the film removing nozzles 30.

Preferably, at least the surfaces of the approach parts 23 of the approach stages 20 are coated with a water repellent film, not shown. The water repellent film coating the surfaces of the approach parts 23 makes difficult for a solvent, such as a thinner, used for removing the thin film, namely, a resist film, to adhere to the approach stages 20. Consequently, generation of particles that will contaminate the substrate M after the dissipation of the solvent can be suppressed.

The gas spouting system 90 will be described. As shown in FIG. 2B, each of the gas spouting heads 89 of the gas spouting system 90 includes spouting port 91a opening in the inner side surface, facing the substrate M supported on the support members, of the flat approach part 23, an inlet port 91b opening in the outer side surface, opposite the inner side surface, of the flat approach part 23, and a discharge passage 91 extended between the spouting port 91a and the inlet port 91b. The gas spouting system 90 includes the gas spouting heads 89, and the supply line 93 provided with the shutoff valve $V_a$ and connecting the inlet port 91b of the flat approach part 23 to the nitrogen gas source 94. The CPU 80, namely, the controller, is electrically connected to the shutoff valve $V_a$. The shutoff valve $V_a$ is controlled by control signals provided by the CPU 80. The shutoff valve $V_a$ is opened to supply nitrogen gas from the nitrogen gas source 94 into the gas passage 91. In FIG. 2B, the nitrogen gas spouted by the gas spouting head of the gas spouting system 90 flows through the gap s between the side surface, facing the corner Mc1 of the substrate M, of the flat approach part 23 and the first side surface Mb1, in the corner Mc1 of the substrate M along the first side surface Mb1 toward a side of the second side surface Mb2. The flow of the nitrogen gas in the gap s can prevent the resist solution removed from the substrate M from flowing from the second side surface Mb2 through a top of the corner Mc1 to the first side surface Mb1 during the operation of the film removing nozzle 30 for removing unnecessary part of the film.

Figure 7:
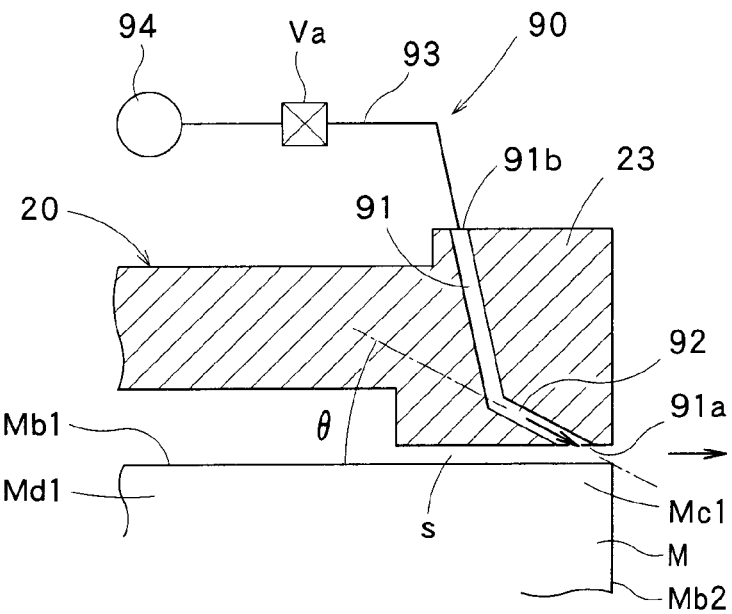
FIG. 7 is a sectional view, corresponding to FIG. 2B, of another example of a gas spouting head of the gas spouting system.

The construction of the gas spouting head of the gas spouting system 90 is not limited to the foregoing construction. For example, it is preferable that at least a part of the discharge passage 91, such as a part 92 of the discharge passage 91, terminating at the spouting pore 91a is inclined to the side surface of the substrate M facing the spouting port 91a, namely, the first side surface Mb1 in FIG. 7, at an acute angle θ, between, for example, 20° and 45°. When the part 92 of the discharge passage 91 is inclined to the side surface of the substrate M at such an acute angle θ, the nitrogen gas spouted into the gap s can flow stably along the side surface of the substrate M. Consequently, the flow of the resist solution to the side surface joined at the top of the corner to the side surface being process can be more surely prevented.

Figure 8:
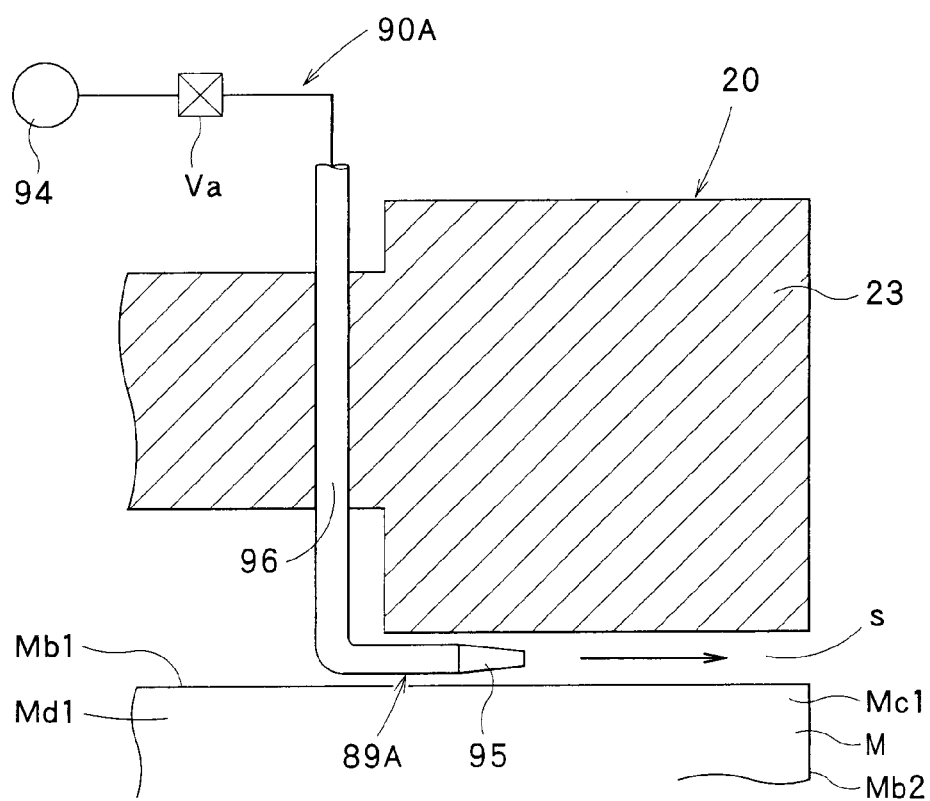
FIG. 8 is a sectional view, corresponding to FIG. 2B, of a third example of a gas spouting head of the gas spouting system.

The gas spouting system 90A may include gas spouting heads 89A as shown in FIG. 8. Each of the gas spouting heads 89A of the gas spouting system 90A includes a nozzle 95 extending parallel to the gap s and the side surface of the substrate M facing the flat approach part 23, and a gas supply line 96 connecting the nozzle 95 to a nitrogen gas source 94. Nitrogen gas can be spouted parallel to the gaps s into the gaps s and hence the flow of the resist solution into the gaps s can be more surely prevented.

Figure 9:
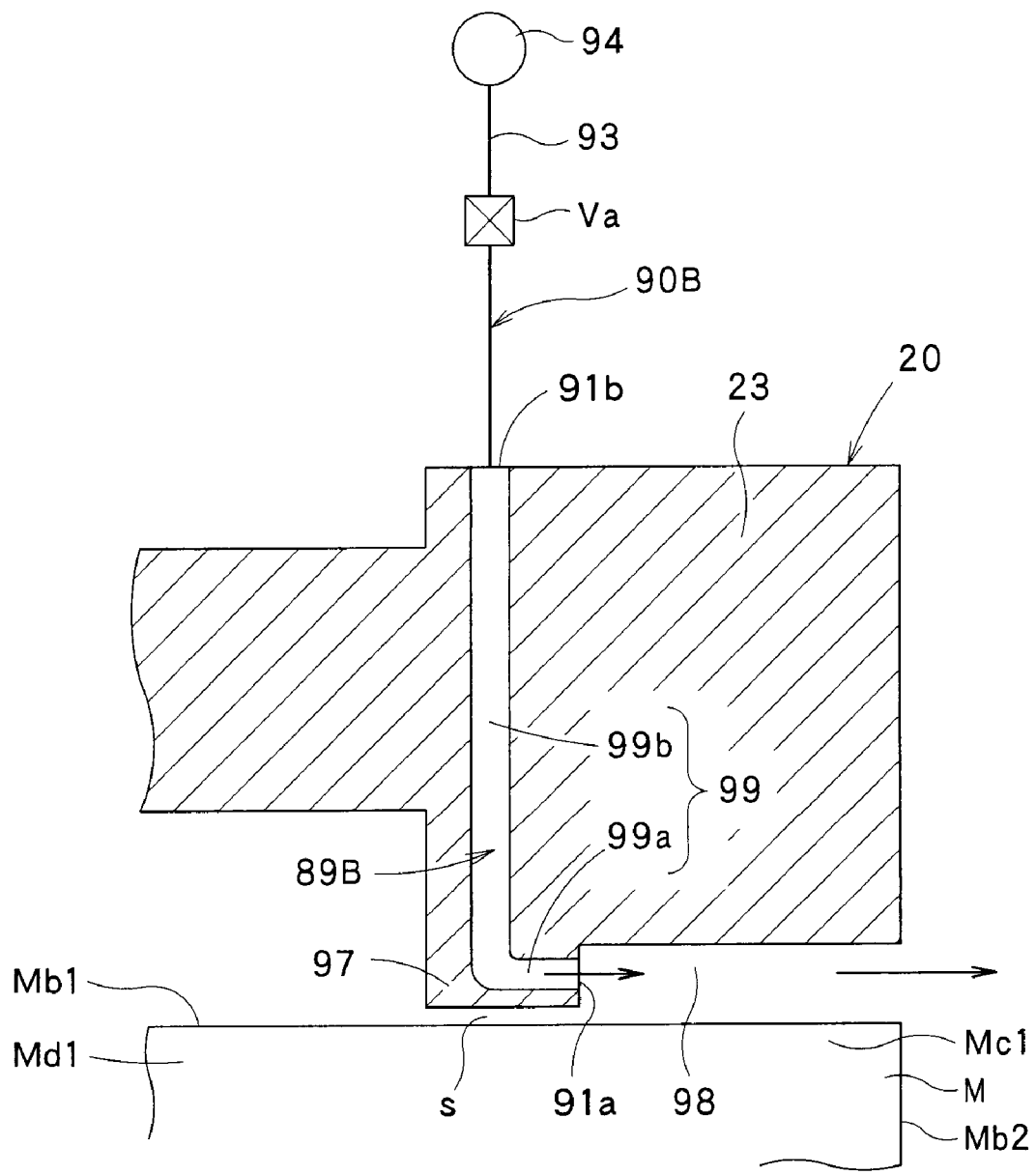
FIG. 9 is a sectional view, corresponding to FIG. 2B, of a fourth example of a gas spouting head of the gas spouting system.

The gas spouting system 90B may include gas spouting heads 89B as shown in FIG. 9. Each of the flat approach part 23 is provided with protrusion 97 facing the substrate M supported on the support members 22. The protrusion 97 protrudes toward one of the two opposite side surfaces (the first side surface Mb1, in the state shown in FIG. 9) of the substrate M supported on the support members 22. The protrusion 97 is positioned at a part on a side of the flat approach part 23 apart from the top of the corner (apart from the second side surface Mb2, in the state shown in FIG. 2A). In other words, the protrusion 97 is formed by forming a recess 98 in a part of the side surface of the flat approach part 23 facing one of the two opposite side surfaces (first side surface Mb1, in the state shown in FIG. 2A) around the top of the corner (first corner Mc1, in the state shown in FIG. 2A). Each gas spouting head 89B of the gas spouting system 90B has a spouting port 91a opening in a surface, facing the recess 98, of the protrusion 97, an inlet port 91b opening in a side surface, opposite to the side surface facing the substrate M, of the flat approach part 23, and a discharge passage 99 extended between the spouting port 91a and the inlet port 91b. The gas spouting system 90B includes the gas spouting heads 89B, and a gas supply line 93 connecting the discharge passage 99 to the nitrogen gas source 94. The discharge passage 99 formed in the flat approach part 23 has a first passage 99a extending in the protrusion 97 and parallel to the side surface of the substrate M facing the flat approach part 23 and a second passage 99b elongated between first passage 99a and the inlet port 91b. According to this gas spouting system 90B, Nitrogen gas spouted through the spouting port 91a can flow parallel to the gap s in the gap s. Thus the flow of the resist solution into the gaps s can be more surely prevented.

Figure 4A:
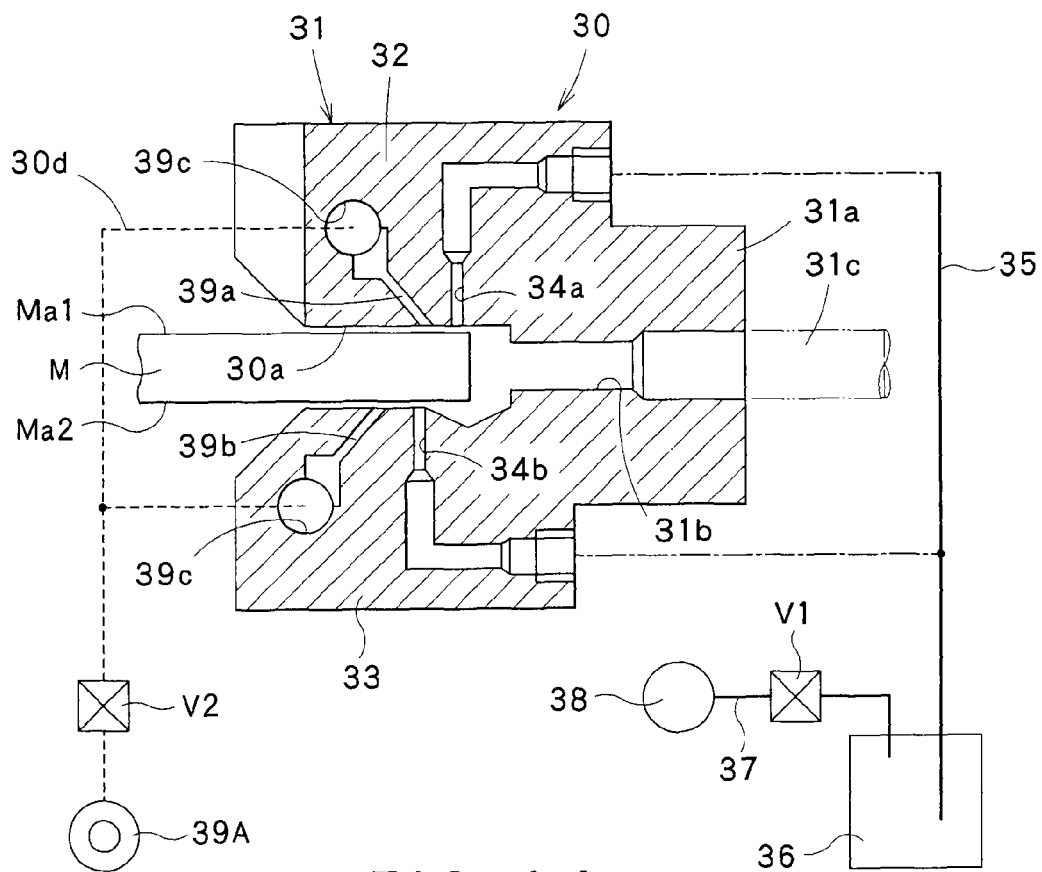
FIG. 4A is a sectional view of a removing unit (resist film removing nozzle) included in the film removing device shown in FIG. 2A.

The film removing nozzle 30, namely, the film removing unit, will be described. As shown in FIG. 4a, the film removing nozzle 30 includes a nozzle head 31 having a head base 31a, an upper projection 32 projecting from the head base 31a, and a lower projection 33 projecting parallel to the upper projection 32 from the head base 31a. The upper projection 32 and the lower projection 33 of the nozzle head 31 define a groove 30a having a bottom formed by the nozzle head 31a. A peripheral part of the substrate M can be received in the groove 30a. When a peripheral part of the substrate M is received in the groove 30a as shown in FIG. 4A, three sides of the peripheral part of the substrate M is surrounded by the inside surfaces of the projections 32 and 33, and the bottom surface of the groove 30a with gaps of a small thickness of, for example, 1 mm formed between the upper surface Ma1 of the substrate M and the inside surface of the upper projection 32 and between the lower surface Ma2 of the substrate M and the inside surface of the lower projection 33, respectively. The upper projection 32 and the lower projection 33 are provided with spouting ports 34a and 34b, respectively, to spout a solvent, such as a thinner, against the upper surface Ma1 and the lower surface Ma2 of the substrate M. The spouting ports 34a and 34b are not aligned with each other. The spouting ports 34a and 334b are connected to a solvent source, for example, a thinner tank 36, by a thinner supply line 35. The thinner tank 36 is connected to a compressed gas source 38 provided with a shutoff valve V1. The compressed gas source 38 supplies a compressed gas, such as compressed nitrogen gas, to the thinner tank 36 to supply the thinner by pressure from the thinner tank 36 to the spouting ports 34a and 34b. The thinner may be pumped from the thinner tank 36 to the spouting ports 34a and 34b instead of supplying the thinner to the spouting ports 34a and 34b by the pressure of the compressed nitrogen gas.

Nitrogen gas spouting ports 39a and 39b are formed in the upper projection 32 and the lower projection 33 at positions near the free ends of the upper projection 32 and the lower projection 33 and remote from the head base 31a, respectively. The nitrogen gas spouting ports 39a and 39b are connected to connecting passages 39c, respectively. The connecting passages 39c are connected to a nitrogen gas source 39A by a nitrogen gas supply line 39d provided with a shutoff valve V2. As shown in FIG. 4A, the nitrogen gas spouting ports 39a and 39b are extended obliquely relative to a direction along which the groove 30a extends so as to spout nitrogen gas in a direction from the center toward the periphery (the side surface) of the substrate M.

The head base 31a of the film removing nozzle 30 is provided with a through hole extending through the head base 31a. An exhaust line 31c connected to an exhaust system, not shown, is connected to the through hole of the head base 31a. The through hole of the head base 31a is used as a suction passage 31b through which an atmosphere in the groove 30a is sucked out together with liquid drops contained in the atmosphere.

Referring to FIGS. 2A and 5, the two film removing nozzles 30 are slidably mounted on two parallel guide rails 41, respectively. The guide rails 41 are disposed on the outer side of the chuck 10 and the support members 22. The film removing nozzles 30 are driven by a moving mechanism 40 including so as to move along the guide rails 41. The moving mechanism 40 includes, for example, a stepping motor 42 and a timing belt 43. The guide rails 41 are extended between the two approach stages 20 parallel to the two other opposite side surfaces (the second side surface Mb2 and the fourth side surface Mb4, in the state shown in FIG. 2A) continuous with the two opposite side surfaces (the side surfaces Mb1 and Mb3, in the state shown in FIG. 2A) extending along the approach stages 20, respectively. Thus each of the film removing nozzles 30 can be moved from a position outside one of the approach stages 20 past a position corresponding to the approach stage 20 through the entire length of the side surface of the substrate M supported on the support members 22 and past a position corresponding to the other approach stage 20 to a position outside the other approach stage 22. The moving mechanism 40 may be a generally known moving mechanism, such as a ball screw or a cylinder actuator.

While the film removing nozzles 30 thus built are being moved along peripheral parts (the edges and the corners) of the substrate M, the thinner is spouted through the spouting nozzle holes 34a and 34b toward the peripheral parts of the substrate M and, at the same time, nitrogen gas is spouted through the nitrogen gas spouting ports 39a and 39b from center side to side surface side of the substrate M so as to resolve and remove unnecessary parts formed on the peripheral parts of the resist film formed on the substrate M. An atmosphere around the peripheral parts of the substrate M is sucked together with liquid drops contained in the atmosphere through the suction passages 31b by the exhaust system so as to remove the thinner spouted onto the peripheral parts of the substrate M together with a solution produced by dissolving the unnecessary parts of the resist film in the thinner from the substrate M.

Figure 11:
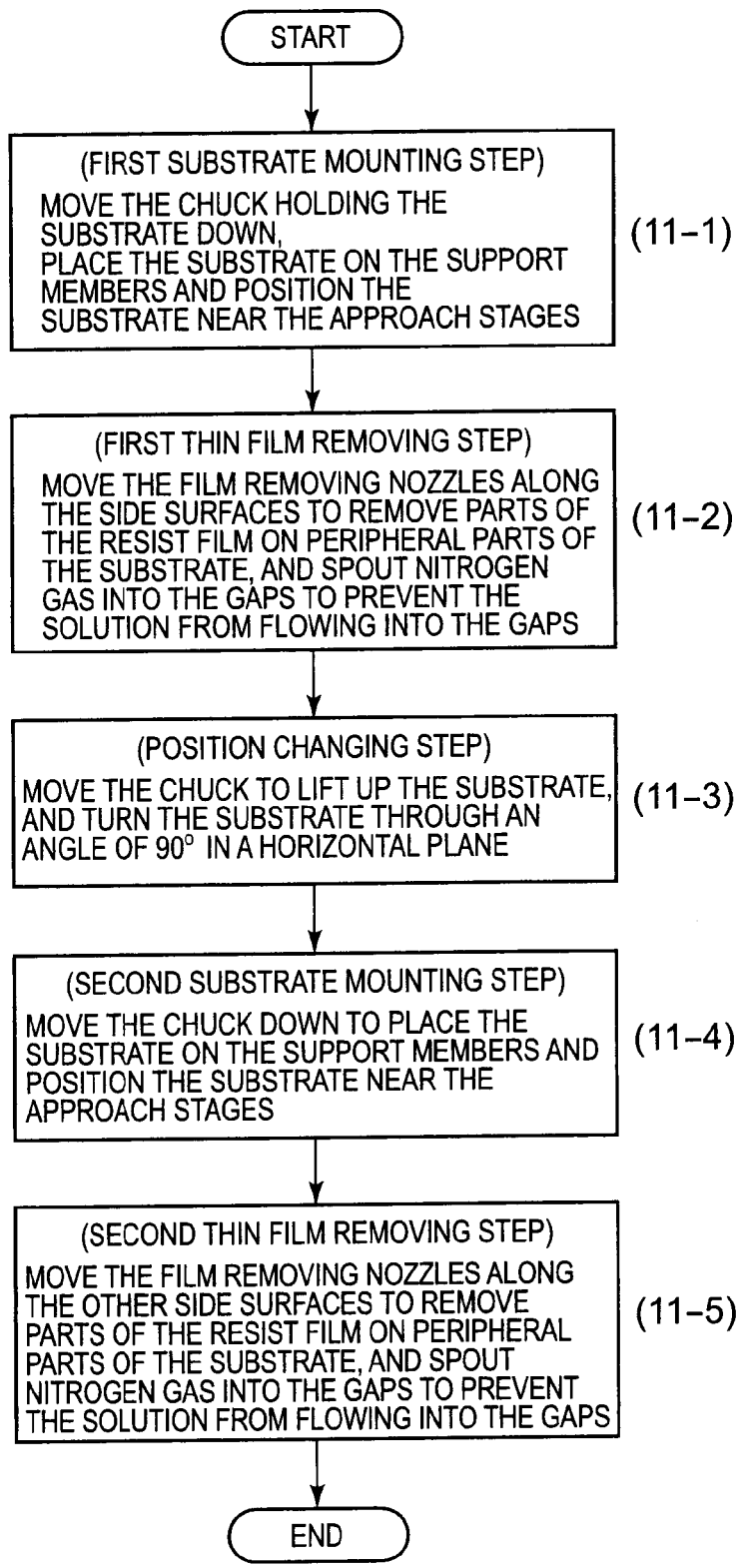
FIG. 11 is a flow chart of a film removing method in one preferred embodiment according to the present invention.

A film removing method using the film removing device of the present invention will be described mainly with reference to mainly FIG. 3, and FIG. 11 showing the film removing method in a flow chart.

The substrate M thus coated with a resist solution film is carried by the pair of carrying arms 8 to the peripheral film removing device 3. The lifting and rotating mechanism 50 is driven to lift up the chuck body 11 of the chuck 10 so as to transfer the substrate M from the carrying arms 8 to the chuck body 11. Then, the carrying arms 8 are moved away from the peripheral film removing device 3. Subsequently, step 11-1 is executed. In step 11-1, the chuck body 11 is lowered so as to place the substrate M on the support members 22 adjacently to the approach stages 20. Then, the two opposite side surfaces (in the state shown in FIG. 2A, the first side surface Mb1 and the third side surface Mb3) of the substrate M are opposite the flat approach parts 23 of the approach stages 20 at the corners where the two opposite side surfaces and the two other opposite side surfaces (in the state shown in FIG. 2A, the second side surface Mb2 and the fourth side surface Mb4) join, and the upper surface Ma1 of the substrate M is substantially flush with the surfaces of the flat approach parts 23 of the approach stages 20.

Figure 4B:
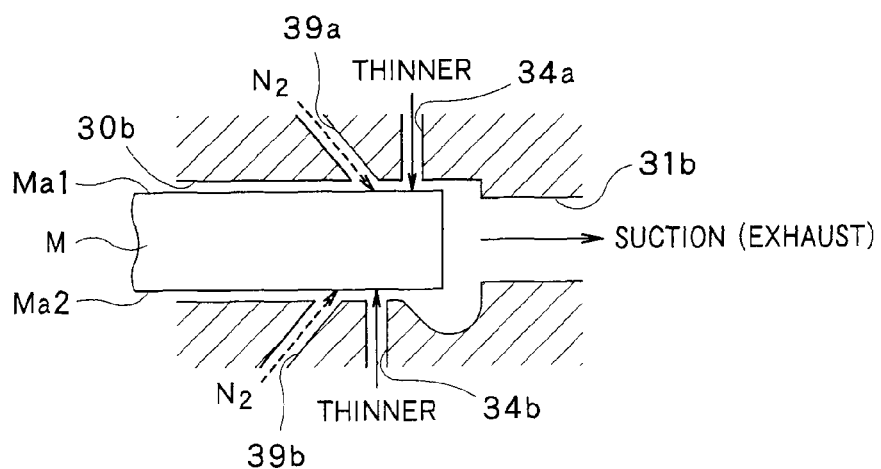
FIG. 4B is a view of assistance in explaining the operation of the removing unit (resist film removing nozzle) shown in FIG. 4A.

Then, the resist film removing process is started in step 11-2. In step 11-2, in a state where the film removing nozzles 30 are held at positions separated from the substrate M supported on the support members 22, the exhaust system, not shown, connected to the suction passages 31b of the film removing nozzles 30 is operated to start sucking the atmosphere through the suction passages 31b (FIGS. 4A and 4B). Then, the shutoff valve V2 is opened to start spouting nitrogen gas through the nitrogen gas spouting ports 39a and 39b of the film removing nozzles 30 and the valve V1 is opened to start spouting the thinner through the spouting nozzle holes 34a and 34b of the film removing nozzles 30. Then, each film removing nozzles 30 is moved continuously from a position outside one of the approach stages 20 past a position level with the approach stage 20 through the entire length of one of the two other opposite side surfaces of the substrate M supported on the support members 22 and past a position level with the other approach stage 20 to a position outside the other approach stage 22. That is to say, each film removing nozzles 30 is moved continuously along one of the two other opposite side surfaces (in the state shown in FIG. 2A, the second side surface Mb2 and fourth side surface Mb4) from one of the approach stages 20 at one of the opposite ends of one of the two other opposite side surfaces to the other approach stage 20 at the other end of one of the two other opposite side surfaces. While the film removing nozzles 30 are thus moved, the thinner is spouted onto peripheral parts respectively extending along the two other opposite side surfaces as shown in FIG. 4B so as to remove unnecessary parts of the resist film formed respectively on the peripheral parts by dissolving the resist film in the thinner. The nitrogen gas spouted through the nitrogen gas spouting ports 39a and 39b prevents a resist solution thus produced by dissolving the resist film in the thinner from spreading from the peripheral parts toward a central part of the substrate M. The resist solution is removed from the substrate M by being sucked through the suction passage 31b. Meanwhile, nitrogen gas supplied from the nitrogen gas source 94 to the nitrogen gas spouting heads 89 of the gas spouting system 90 is spouted into the gaps s each formed between the corner of the substrate M and the flat approach part 23 of the approach stage 20. As shown in FIG. 2B, the nitrogen gas spouted into each gap s flows along the side surface (the first side surface Mb1, in the state shown in FIG. 2B) facing the approach stage 20 toward a side of a side surface (the second side surface Mb2, in the state shown in FIG. 2B) continuous with the former side surface. Thus the resist solution is prevented from flowing into the gaps s.

As apparent from the foregoing description and FIG. 2A, it is understood that, in the state shown in FIG. 2A, the respective peripheral parts of the two other opposite side surfaces (the second side surface Mb2 and the fourth side surface Mb4, in the state shown in FIG. 2A) are processed simultaneously by the resist film removing process because the two approach stages 20 are dispose opposite to the two opposite side surfaces (the first side surface Mb1 and the third side surface Mb3, in the state shown in FIG. 2A), and the film removing nozzles 30 move along the two other opposite side surfaces, respectively. The thinner spouted by the film removing nozzles 30 before starting the resist film removing process can be prevented from splashing on the peripheral parts of the substrate M by the approach stage 20 disposed on the side of the starting positions of the film removing nozzles 30. Since the approach stages 20 are disposed near the side surfaces of the substrate M, the thinner can be constantly spouted and sucked while the film removing nozzles 30 are moved across the approach stages 20 and along the tow other opposite side surfaces of the substrate M, respectively. Consequently, unnecessary parts of the resist film on the peripheral parts extending along the two other opposite side surfaces of the substrate M can be removed. The resist solution flowing along the side surface across the top of the corner toward the adjacent side surface of the substrate M can be removed. Thus straight parts of the resist film on the corners of the substrate M can be removed and the creation of mist can be suppressed. That is to say, the peripheral parts of the substrate M extending along the side surfaces of the substrate M opposite the film removing nozzles 30 can be stably and uniformly processed. Therefore, the resist film removing process can suppress staining parts of the resist film formed on the substrate.

Then, step 11-3 is executed after the unnecessary parts of the resist film have been removed from the peripheral parts extending along the two other opposite side surfaces of the substrate M, respectively. In step 11-3, in the state shown in FIG. 2A, the film removing nozzles 30 are returned to their home positions indicated by two-dot chain lines and separated from the substrate M supported on the support members 22, and from the approach stage 20. Then, the rotating and lifting mechanism 50 is driven so as to lift up the chuck body 11. Thus the substrate M supported on the support members 22 is transferred to the chuck body 11. Then, the chuck 10 lifts up the chuck body 11 to an elevated position as indicated by the arrow (1) in FIG. 3 so as to hold the substrate M at a position above the support members 22. Subsequently, the lifting and rotating mechanism 50 turns the chuck body 11 supporting the substrate M and held at the elevated position through an angle of 90° as indicated by the arrow (2) in FIG. 3 so as to change the angular position of the substrate M. Then, step 11-4 is executed. In step 11-4, the rotating and lifting mechanism 50 moves the chuck body 11 down as indicated by the arrow (3) in FIG. 3 so as to place the substrate M on the support members 22. Thus, the two other opposite side surfaces of the substrate M from which the parts of the resist film have been removed are positioned adjacently to the approach stages 20. More concretely, the two other opposite side surfaces of the substrate M are opposite the flat approach parts 23 of the approach stages 20 at the corners where the two other opposite side surfaces and the two opposite side surfaces join, and the upper surface Ma1 of the substrate M is substantially flush with the surfaces of the flat approach parts 23 of the approach stages 20.

Then, step 11-5 is executed. In step 11-5, the same resist film removing process is executed so as to remove unnecessary parts of the resist film from peripheral parts extending along the two opposite side surfaces parallel to the paths of the film removing nozzles 30. More concretely, the film removing nozzles 30 are moved along the two opposite side surfaces (for example, the first side surface Mb1 and the third side surface Mb3) and across the approach stages 20. The solvent is spouted onto the peripheral parts extending along the two opposite side surfaces of the substrate M extending along the paths of the film removing nozzles 30 by the film removing nozzles 30 and the resist solution is removed from the substrate M by being sucked through the suction passage 31b. Meanwhile, nitrogen gas supplied to the nitrogen gas spouting heads 89 of the gas spouting system 90 is spouted by the nitrogen gas spouting heads 89 of the gas spouting system 90 into the gaps s each formed between the side surfaces, facing the corner of the substrate M, of the approach stage 20 and the two other opposite side surfaces (for example, the second side surface Mb2 and the fourth side surface Mb4) so as to prevent the flow of the resist solution into the gaps s. Thus straight parts of the resist film on the corners of the substrate M can be removed and the creation of mist can be suppressed. Therefore, the resist film removing process can suppress staining parts of the resist film formed on the substrate.

After the resist film removing process for removing the unnecessary parts of the resist film from the substrate M has been completed, the film removing nozzles 30 are returned to and held at the home positions until the next cycle of the resist film removing process is started. The lifting and rotating mechanism 50 lifts up the chuck body 11 of the chuck 10. A substrate carrying arm, not shown, disposed outside the casing 1 of the peripheral resist film removing system 120 approaches the peripheral film removing device 3 and receives the processed substrate M from the chuck body 11 being lifted up. The foregoing steps of the resist film removing process are repeated to remove unnecessary parts of the resist films respectively formed on substrates M.

Various changes are possible in the foregoing embodiment. Modifications of the foregoing embodiment will be described with reference to the drawings, in which description of parts like or corresponding to those of the foregoing embodiment will be omitted to avoid duplication.

In the foregoing embodiment, each of the gas spouting system 90 (90B) of the foregoing embodiment includes the gas spouting heads 89 (89B), the nitrogen gas source 94 (94), and the supply line 93 (93) provided with a shutoff valve $V_a$ ($V_a$) and connecting the nitrogen gas source 94 (94) to the gas spouting heads 89 (89B), the gas spouting heads 89 (89B) having the spouting port 91a (91a) opening in the side surface, facing the substrate M supported on the support members 22, of the flat approach part 23, an inlet port 91b (91b) opening in the outer side surface, opposite the inner side surface, of the flat approach part 23, and a discharge passage 91 extended between the spouting port 91a and the inlet port 91b. The gas spouting system 90A includes the gas spouting head 89A having the nozzle 95 extending parallel to the gap s, the nitrogen gas source 94, and a gas supply line 96 connecting the nozzle 95 to the nitrogen gas source 94. Gas spouting systems other than those mentioned above may be used.

Figure 10A:
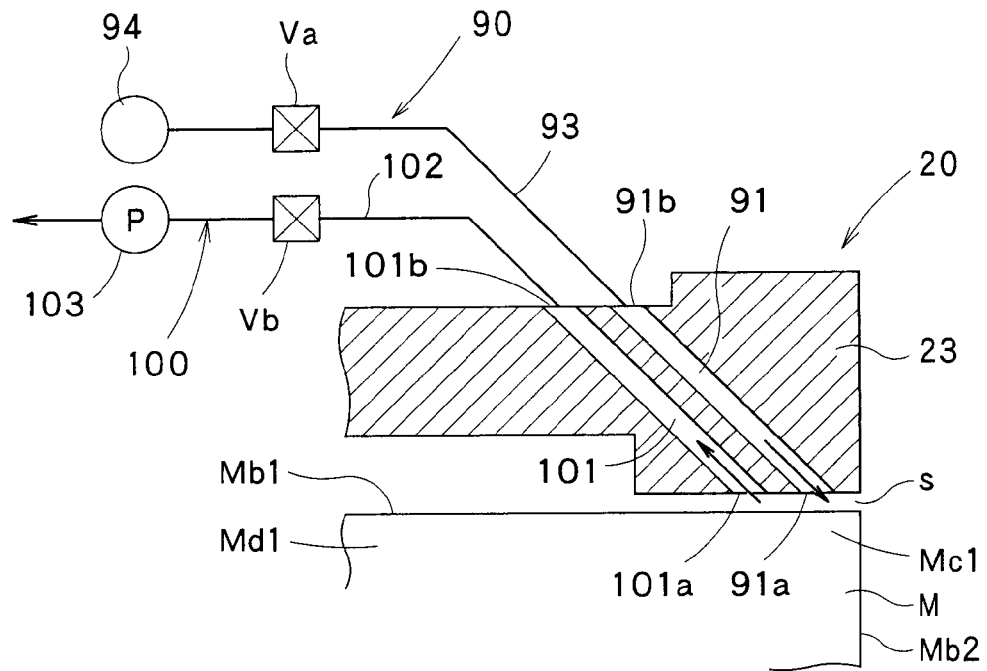
FIG. 10A is a sectional view, corresponding to FIG. 2B, of a suction mechanism and a gas spouting head of the gas spouting system included in the film removing device.
Figure 10B:
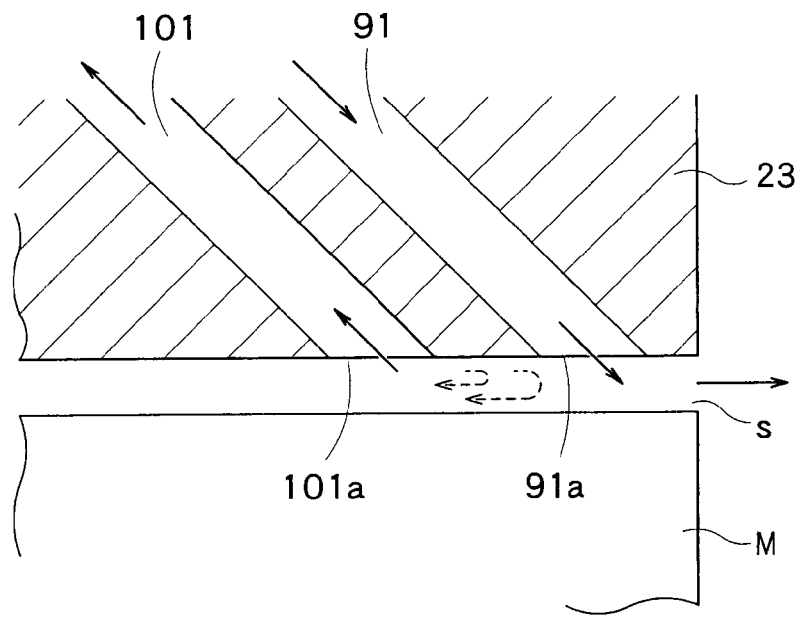
FIG. 10B is a view of assistance in explaining the operation of the suction mechanism and a gas spouting system of the gas spouting system shown in FIG. 10A.

For example, in addition to the gas spouting system 90, 90A or 90B, the suction mechanism 100 may be incorporated into the flat approach part 23 so as to suck a gas, or a gas and liquid drops (mist) from the gap s formed between the flat approach part 23 of the approach stage 20 and the corner of the substrate M supported on the support members. A suction mechanism 100 shown in FIG. 10A includes an inlet 101a opening in the side surface, facing the substrate M supported on the support members 22, of the flat approach part 23, an outlet 101b opening in the outer side surface, opposite the inner side surface, of the flat approach part 23, and a suction line 102 extended between the spouting port 91a and the inlet port 91b, and a suction line 102 connecting the outlet 101b to a suction device, such as a vacuum pump 103. The spouting port 91a of the gas spouting head 89 of the gas spouting system 90 is opened in the inner side surface of the flat approach part 23 facing the side surface of the substrate M at a position on the side of the side surface (the second side surface Mb2, in the state shown in FIG. 10A) along which the film removing nozzle 30 moves with respect to the inlet 101a of the suction mechanism 100. The suction line 102 of the suction mechanism 100 shown in FIG. 10A is provided with a shutoff valve Vb. The vacuum pump (the suction device) 103 and the shutoff valve Vb are electrically connected to the CPU 80, namely, the controller. Operations of the shutoff valve Vb and the vacuum pump 103 are controlled by control signals provided by the CPU 80. The shutoff valve Vb is opened and the vacuum pump 103 is actuated to suck an atmosphere in the gap s containing nitrogen gas, the resist solution and the mist remaining in the gap s are sucked and discharged. Thus the flow of the resist solution into the gap s and the adhesion of the resist solution to the substrate M can be prevented.

The gas is spouted into the gap s between the inner side surface of the flat approach part 23 of the approach stage toward a side of the side surface of the substrate M being processed by the film removing nozzle 30 and, at the same time, the suction mechanism 100 can suck out the gas and the mist remaining in the gap s. Thus an unnecessary part of the gas spouted by the gas spouting system 90 into the gap s and flowing toward a side of an inner part of the substrate M (a opposite side of the side surface of the substrate M being processed by the film removing nozzle 30) and the mist can be removed.

In the foregoing embodiment, each of the gas spouting system 90, 90A or 90B spouts nitrogen gas into the gaps s each formed between the side surface of the flat approach part 23 of the approach stage 20 facing the substrate M and the part of the side surface near the corner of the substrate opposite to the flat approach part 23 toward a side of the adjacent side surface of the substrate M being processed by the film removing process so as to prevent the flow of the resist solution from the side of the side surface of the substrate M being processed by the film removing process into the gap s. The gas spouting mechanism 90, 90A or 90B may be omitted and the flow of the resist solution into the gaps s may be prevented by the sucking operation of the film removing nozzles 30.

Figure 12A:
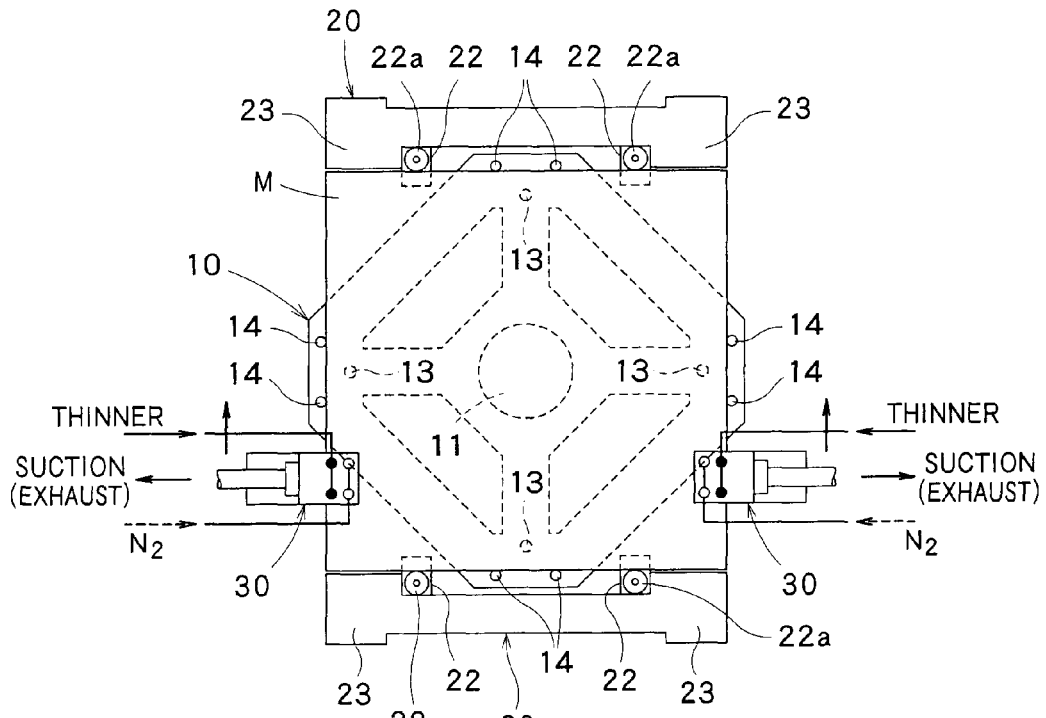
FIGS. 12A and 12B are schematic plan views of a modification of a film removing device.
Figure 12B:
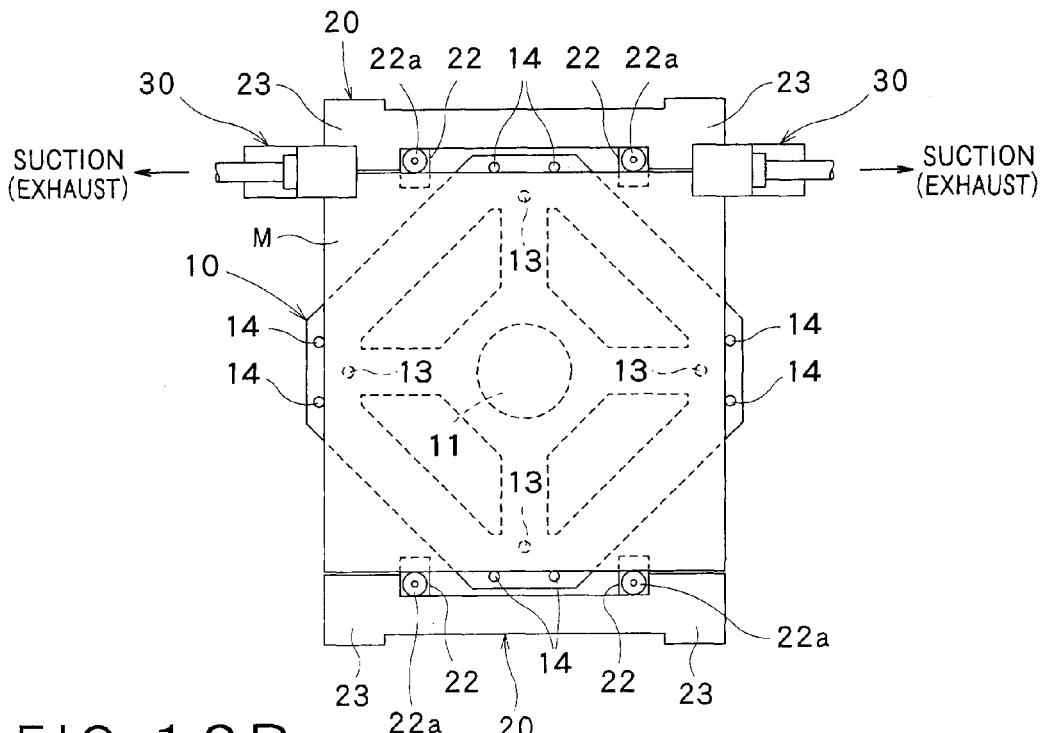

A peripheral film removing device in modification of the peripheral film removing device 3 shown in FIG. 2A will be described with reference to FIGS. 12A and 12B. As shown in FIG. 12A, by way of example, each of film removing nozzles 30, spouting a thinner and nitrogen gas and in a suction operation, is moved from one of opposite approach stages 20 along a side surface of a substrate M in the direction of the arrow shown in FIG. 12A. The film removing nozzle 30 is moved continuously along the side surface of the substrate M so as to remove an unnecessary part of the resist film from a peripheral part extending along the side surface of the substrate M by the foregoing method. Then, upon the arrival of the film removing nozzle at a position corresponding to a gap s as shown in FIG. 12B, the spouting operation for spouting the thinner and the nitrogen gas is stopped and only the sucking operation is continued so as to suck an atmosphere together with liquid drops contained in the atmosphere in the gap s by the film removing nozzle 30. Thus the flow of a resist solution into the gaps s and the adhesion of the resist solution to the substrate M can be prevented.

Figure 13:
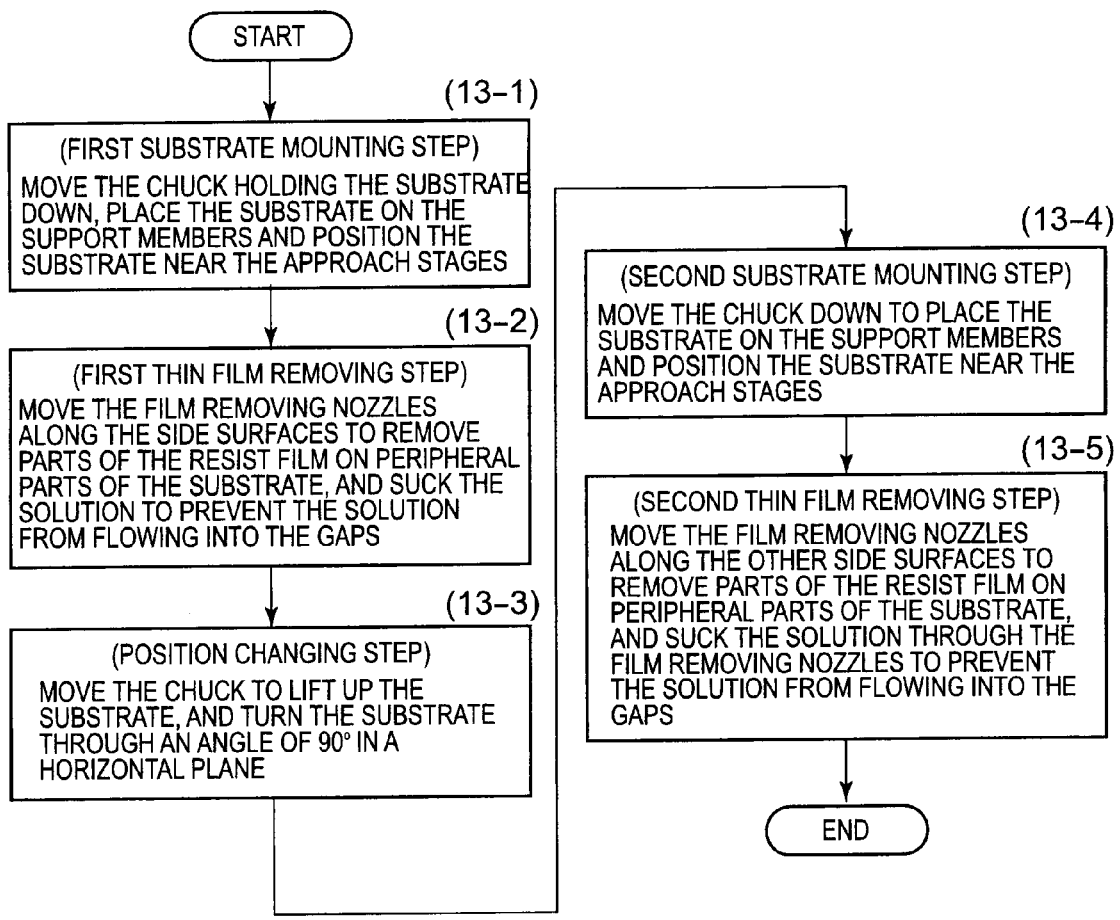
FIG. 13 is a flow chart of a modification of a film removing method.

The operation of the peripheral film removing device in the modification shown in FIGS. 12A and 12B will be described with reference to a flow chart shown in FIG. 13. In step 13-1, carrying arms 8 carry a substrate M to the peripheral film removing device 3 and transfers the substrate M to a chuck 10. Then, the chuck 10 is moved down so as to mount the substrate M on support members 22, and approach stages 20 are positioned close to the substrate M.

Then, in step 13-2, each of film removing nozzles 30 previously started a spouting operation for spouting a thinner and nitrogen gas and a sucking operation is moved continuously from one of the approach stages 20, namely, a first approach stage 20, along a side surface of the substrate M to the other approach stage 20, namely, a second approach stage 20, so as to resolve and remove an unnecessary part, formed on a peripheral part of the substrate M extending along the side surface, of a resist film formed on the substrate M. Upon the arrival of the film removing nozzle 30 at a position corresponding to a gap s formed between a side surface of the second approach stage 20 and a part of a side surface of the substrate M in a corner where the side surface extending along the second approach stage 20 and the side surface along which the film removing nozzle 30 moved join, the spouting operation of the film removing nozzle 30 for spouting the thinner and nitrogen gas is stopped or not stopped, and the sucking operation is continued so as to prevent the flow of a resist solution into the gap s. When the sucking operation is continued without stopping the spouting operation for spouting the thinner and nitrogen gas of the film removing nozzle 30, it is desirable to continue the sucking operation while the film removing nozzle 30 is moved at a low moving speed.

Then, in step 13-3, the film removing nozzles 30 are returned to their home positions after the unnecessary parts of the resist film have been removed from the peripheral parts extending along the two opposite side surfaces of the substrate M, respectively. Then, a rotating and lifting mechanism 50 is driven so as to lift up the chuck body 11 of the chuck 10. Then, the chuck 10 is turned through an angle of 90° to change the angular position of the substrate M. Then, step 13-4 is executed. In step 13-4, the chuck 10 is moved down so as to place the substrate M on support members 22, and the approach stages 20 are positioned near the substrate M.

Then, step 13-5 is executed. In step 13-5, the same resist film removing process is executed so as to remove unnecessary parts of the resist film from peripheral parts extending along the next opposite side surfaces parallel to the paths of the film removing nozzles 30. The thinner and nitrogen gas are spouted by the film removing nozzles 30, while an atmosphere with liquid drops contained in the atmosphere is sucked through suction passages 31b respectively formed in the film removing nozzles 30 so as to remove unnecessary parts of the resist film from peripheral parts of the substrate M extending along the next other side surfaces of the substrate M by a film removing process. Upon the arrival of the film removing nozzle 30 at a position corresponding to a gap s formed between the side surface of the second approach stage 20 and a part of a side surface of the substrate M in a corner where the side surface extending along the approach stage 20 and the side surface along which the film removing nozzle 30 moved join, the spouting operation of the film removing nozzle 30 for spouting the thinner and nitrogen gas is stopped or not stopped, and the sucking operation is continued so as to prevent the flow of a resist solution into the gap s.

After the resist film removing process for removing the unnecessary parts of the resist film from the substrate M has been completed, the film removing nozzles 30 are returned to and held at the home positions until the next cycle of the resist film removing process is started. The lifting and rotating mechanism 50 lifts up the chuck body 11 of the chuck 10. A substrate carrying arm, not shown, disposed outside the casing 1 of the peripheral resist film removing system 120 approaches the peripheral film removing device 3 and receives the processed substrate M from the chuck body 11 being lifted up. The foregoing steps of the resist film removing process are repeated to remove unnecessary parts of the resist films respectively formed on substrates M.

The film removing devices and the film removing methods in the foregoing embodiment and the modification have been described as applied to removing unnecessary parts of the resist film formed on the photomask substrate. The film removing device and the film removing method of the present invention are applicable to removing unnecessary parts of a film formed on substrates having corners other than the photomask substrate, such as glass substrates for a FPDs and glass substrates for a LCDs.

What is claimed is:

1. A film removing device for removing an unnecessary part, formed on a peripheral part of a substrate having a corner, of a film of a coating solution formed on the substrate by spouting a solvent on the peripheral part of the substrate, said film removing device comprising:
   a support member that supports the substrate;
   an approach stage disposed near a first side surface of the substrate supported on the support member, the approach stage having a flat approach part having a surface flush with a surface of the substrate supported on the support member;
   a film removing unit provided with a spouting port through which the solvent is spouted toward the peripheral part of the substrate supported on the support member and a suction port through which a solution is sucked;
   a moving mechanism configured to move the film removing unit along a second side surface, continuous with the first side surface, of the substrate supported on the support member and the approach stage; and
   a gas spouting system configured to spout a gas into a gap formed between the flat approach part of the approach stage and the substrate supported on the support member;
   wherein the flat approach part faces the first side surface of the substrate supported on the support member at the corner where the first side surface and the second side surface join, and
   the gas spouting system has a spouting port opening in the side surface, facing the substrate, of the flat approach part, and a discharge passage having one end connected to the spouting port so that the gas spouting system spouts the gas into the gap formed between the side surface, facing the substrate, of the flat approach part and the first side surface, corresponding to the corner, of the substrate supported on the support member along the first side surface toward a side of the second side surface.

2. The film removing device according to claim 1, wherein at least a part, including the one end connected to the spouting port and extending near the substrate supported on the support member, of the discharge passage is inclined at an angle of 45° or below to a direction parallel to the first side surface of the substrate supported on the support member.

3. The film removing device according to claim 1, wherein the gas spouting system has a nozzle having a discharge passage substantially parallel to the first side surface of the substrate supported on the support member so as to spout the gas in a direction substantially parallel to the first side surface of the substrate.

4. The film removing device according to claim 1, wherein: the flat approach part has a protrusion protruding toward the substrate; the gas spouting system is provided with a spouting port opening in the protrusion and a discharge passage having one end connected to the spouting port; the discharge passage is extended in the protrusion from the spouting port substantially parallel to the first side surface of the substrate supported on the support member; and the gas spouting system spouts the gas in a direction substantially parallel to the first side surface of the substrate supported on the support member.

5. The film removing device according to claim 1 further comprising a suction mechanism that sucks a gas, or a gas and a liquid drop from the gap between the flat approach part of the approach stage and the substrate supported on the support member.

6. The film removing device according to claim 5, wherein: the gas spouting system has a spouting port opening in the side surface, facing the substrate, of the flat approach part, and a discharge passage having one end connected to the spouting port;

the suction mechanism has a suction port opening in the side surface, facing the substrate, of the flat approach, and a suction passage having one end connected to the suction port; and the spouting port of the gas spouting system opens in the side surface of the flat approach part facing the substrate at a position nearer to the second side surface of the substrate than the suction port of the suction mechanism.

7. The film removing device according to claim 1 further comprising a substrate holding mechanism, that delivers a substrate to and receives the same from the support member, capable of moving vertically and of turning about a vertical axis through an angle of 90°.

* * * * *